United States Patent [19]

Lunycz

[11] 4,122,599
[45] Oct. 31, 1978

[54] ELECTRICAL METER CONNECTING AND DISCONNECTING DEVICE

[76] Inventor: Alexander N. Lunycz, 225½ Annette St., Toronto, Ontario, Canada, M6P 1P9

[21] Appl. No.: 847,748

[22] Filed: Nov. 2, 1977

[30] Foreign Application Priority Data

Nov. 18, 1976 [CA] Canada .................................. 266056

[51] Int. Cl.² ............................................ H05K 13/04
[52] U.S. Cl. ...................................... 29/758; 29/267; 29/759; 29/764
[58] Field of Search ................ 29/758, 764, 759, 739, 29/741, 267

[56] References Cited

U.S. PATENT DOCUMENTS

| 2,513,821 | 7/1950 | Schneider | 29/764 X |
|---|---|---|---|
| 3,197,848 | 8/1965 | Eichacker | 29/758 |

Primary Examiner—Carl E. Hall
Attorney, Agent, or Firm—James T. Wilbur

[57] ABSTRACT

The device is useful for attaching and detaching an electrical meter of the type having a base secured to a glass enclosure and to one or more prongs. The prongs in turn are adapted to fit into sockets provided in a meter base having a rim provided with a flange spaced apart from the meter base. The device includes a U-shaped stabilizing member having pads mounted at the free end. The pads are accommodated in the space between the flange and the meter base. A collar is slideably connected to the stabilizing member and is adapted to releasably engage the glass enclosure. A handle is pivotally connected to the stabilizing member and two or more links pivotally interconnect the handle and the collar for causing the collar to slide relative to the stabilizing member upon pivotal movement of the handle. Such pivotal movement causes the prongs to move selectively into and out of the sockets.

3 Claims, 3 Drawing Figures

ELECTRICAL METER CONNECTING AND DISCONNECTING DEVICE

The present invention pertains to meter installing and removing devices and more particularly to devices for use in the installation and removal of glass enclosed meters in order to avoid damage to the meter and breakage of the glass enclosure.

Conventional electrical meters and various other kinds of meters are enclosed in glass in order to permit readings to be taken without removal of any parts of the meters. The meters usually consist of a circular base to which the inner mechanism is attached. The base is provided with an annular groove at its periphery for accommodation of the open end of the glass. The base of the meter has a plurality of prongs disposed thereon which are adapted to fit into conforming sockets which are disposed on a meter base.

In order to install the meter, the general practice is to rotate the meter until its prongs are aligned with the sockets. The prongs are then forced into the sockets usually by hitting the outwardly extending end of the glass enclosure sharply with the palm of the hand. This procedure frequently causes damage to the meter or causes the meter to go out of calibration. Moreover the procedure may even be dangerous in that should the glass enclosure be slightly defective or should the installer hit the glass too hard, the glass will break and cause serious injury to the installler's hand.

The principal object of the present invention is to provide a device which is useful for the installation and removal of glass enclosed meters and which is designed to prevent damage to the meter and to avoid breakage of the glass enclosure. The device is connected to a meter by means of a collar which encircles and releasably clamps the outer wall of the glass enclosure. Once clamped the meter may be installed without application of force to the outer end of the glass enclosure.

Another object of the invention is to provide a device which is simple and economic of construction and easy to use.

These and other objects are accomplished by a device for attaching and detaching a meter of the type having a base secured to a glass enclosure and to at least one prong which is adapted to fit into a socket provided in a meter base, said meter base having a rim provided with a flange spaced apart from said meter base, said meter base, said device comprising: a stabilizing member adapted to contact the meter base and having a pad adapted to be disposed in the space between said flange and said meter base; clamping means slideably connected to the stabilizing member and adapted to releasably engage the glass enclosure; a handle pivotally connected to the stabilizing member; and link means pivotally connected to the clamping means and to the handle for causing the clamping means to slide relative to the stabilizing member upon pivotal movement of the handle whereby the meter prong is caused to move selectively into and out of the socket.

The invention will now be described further with reference to the accompanying drawing in which.

Like reference characters refer to like parts throughout the description of the drawing.

Figure 1:
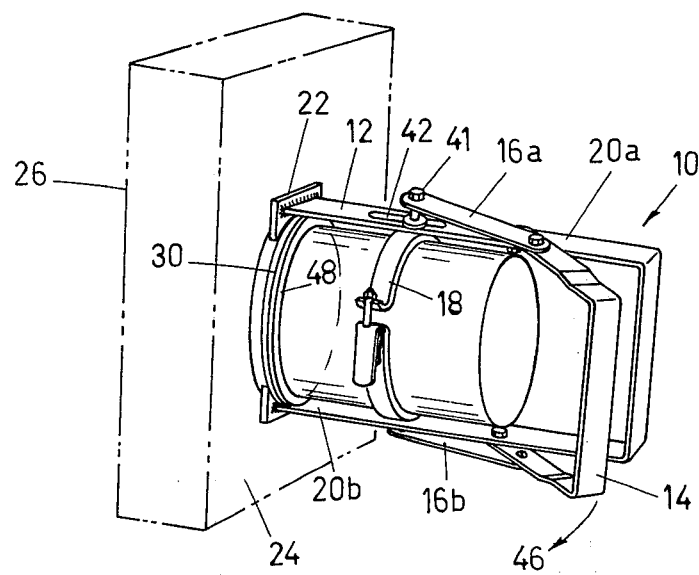
FIG. 1 is a perspective view of a preferred embodiment of installing and removal device shown in conjunction with an electrical meter and a meter base.

With reference to FIG. 1, the glass enclosed meter installing and removal device indicated generally by the numeral 10 includes a U-shaped stabilizing member 12, a U-shaped handle 14, a pair of links 16a,b and clamping means 18. The stabilizing member 12 is made up of a pair of spaced apart legs 20a,b to which a pad 22 is secured at the free end of each. The inner wall 22a of the pad is curved to the shape of the rim wall and illustrated in FIG. 3, the pad is adapted to be positioned in the space between the outerwall 24 of the meter base 26 and the outer flange 28 of a conventional circular rim 30 attached to the meter base. When so positioned, the pad resists removal of the member from the rim by the application of outward force. The only way the pads may be connected to and disconnected from the rim is by applying a separating force to the legs of the stabilizing member so that they will clear the flange as the pads are moved into and out of contact with the rim.

Stabilizing member 12 should be constructed of sufficiently flexible material that a separating force can be applied relatively easily. The pads may then be positioned beneath the flange and removed therefrom easily.

Figure 2:
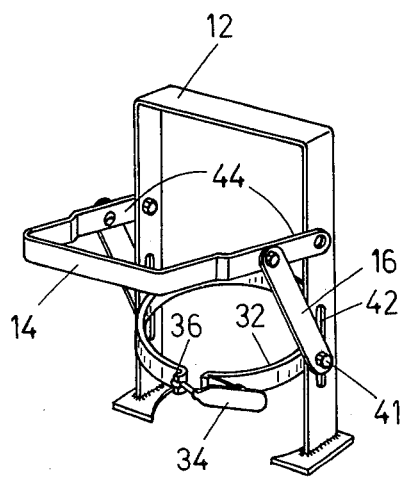
FIG. 2 is another perspective view of the device in the absence of the meter and meter base.
Figure 3:
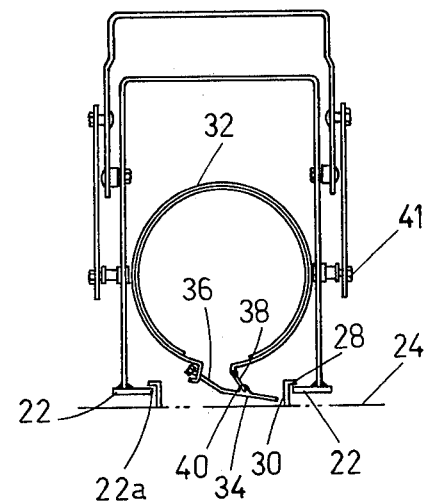
FIG. 3 is an elevation of the device shown in conjunction with a portion of the meter base.

With reference to FIGS. 2 and 3, the clamping means 18 includes an elongated generally circular collar 32 which is composed of flexible material and which is adapted to encircle the glass enclosure. Preferably the inner surface of the collar is lined with soft rubber or polymeric material to prevent the collar from damaging the glass enclosure. The collar can be clamped about the glass enclosure by means of a latch 34. The latch is movably secured to one end of the collar by means of a toggle 36. A second toggle 38 is pivotally connected to the other end of the collar and to an ear 40 on the inside wall of the latch. As the latch is moved into contact with the collar outer wall, the two ends of the collar approach each other thereby tightening the collar about the glass enclosure.

Pins 41 project outwardly from diametrically opposite points of the collar. The pins extend through slots 42 formed in each leg of stabilizing member 12 and the free end of each pin is pivotally connected to an end of each link 16. The other ends of the links are pivotally connected to opposite limbs 44 of handle 14. The point of connection of each link of the limb is approximately midway between the ends of the limb. The free ends of the limbs 44 are pivotally connected to stabilizing member 12.

The glass meter installing device of the invention may be used to remove a glass enclosure from meter base 26 by first breaking the seal, if any, which joins rim 30 to the circular base 48 of the meter, then positioning the collar of the clamping means so that it may be moved along the glass enclosure to the position illustrated in FIG. 1.

The legs of the stabilizing member 12 are then manually separated sufficiently so that pads 22 clear the outer edges of flange 28. The pads are then positioned in the space between the flange and the meter base and handle 14 is then rotated in the direction of arrow 46 until the collar is adjacent to the circular base 48 of the meter. The collar is then clamped to the glass enclosure by tightening of the latch but tightening should be carried out gradually since too sudden latch tension might cause the glass to break.

Once the collar is clamped to the glass enclosure the handle should be rotated in the direction opposite to arrow 46 to cause the clamping means to slide relative to the stabilizing member 12 whereby the prongs of the meter are removed from the sockets of the meter base. As the prongs are removed, the pads 22 of the stabilizing members are forced into contact with the meter base.

To attach a meter to a meter base, the foregoing operation is reversed. Collar 32 of the clamping means is tightened about the glass enclosure, while the handle is at its furthest extent from the meter base. Pads 22 are then positioned in the space between the meter base and rim 30 and the prongs of the meter are aligned with the sockets of the meter base. The handle is then rotated in the direction of arrow 46 to cause the prongs to enter the sockets.

It will be understood of course that modifications can be made in the preferred embodiment of the invention described and illustrated herein without departing from the scope of purview of the invention as defined in the appended claims.

I claim:

1. A device for attaching and detaching a meter of the type having a base secured to a glass enclosure and to at least one prong for insertion into a socket provided in a meter base, said meter base having a rim provided with a flange spaced apart from said meter base, said device comprising: a stabilizing member for contacting said meter base and having a pad for accommodation in the space between said flange and said meter base; clamping means slideably connected to said stabilizing member for releasably engaging said glass enclosure; a handle pivotally connected to said stabilizing member; and link means pivotally connected to said clamping means and to said handle for causing the clamping means to slide relative to said stabilizing member upon pivotal movement of the handle whereby said meter prong is caused to move selectively into and out of said socket.

2. A device for attaching and detaching a meter of the type having a base secureed to a glass enclosure and to at least one prong for insertion into a socket provided in a meter base, said meter base having a rim provided with a flange spaced apart from said meter base, said device comprising: a U-shaped stabilizing member having a pair of spaced apart legs provided with pads at the free ends for accommodation in the space between said flange and said meter base; clamping means disposed between said legs and slideably connected thereto, said clamping means having a collar for encircling and releasably engaging said glass enclosure; a handle pivotally connected to said stabilizing member; and link means pivotally connected to said clamping means and to said handle for causing the clamping means to slide relative to the stabilizing member upon pivotal movement of the handle whereby said meter prong is caused to move selectively into and out of said socket.

3. A device for attaching and detaching a meter of the type having a base secured to a glass enclosure and to at least one prong which is adapted to fit into a socket provided in a meter base, said meter base having a rim provided with a flange spaced apart from said meter base, said device comprising: a U-shaped stabilizing member having a pair of spaced apart legs each provided with an elongated slot and a pad disposed at its free end for accommodation in the space between said flange and said meter base; a U-shaped handle having a pair of limbs each pivotally connected to a respective leg of said stabilizing means; clamping means disposed in the space defined by said legs, said handle and said pads, said clamping means provided with a pair of oppositely extending pins which extend through said slots; and a pair of link means each pivotally connected to a respective said pin and limb for causing the clamping means to slide relative to the stabilizing member upon pivotal movement of the handle whereby said meter prong is caused to move selectively into and out of said socket.

* * * * *